United States Patent
Hsiao et al.

(10) Patent No.: US 11,961,880 B2
(45) Date of Patent: Apr. 16, 2024

(54) METAL-INSULATOR-METAL STRUCTURE

(71) Applicant: Taiwan Semiconductor Manufacturing Company, Ltd., Hsinchu (TW)

(72) Inventors: Yuan-Yang Hsiao, Hsinchu (TW); Hsiang-Ku Shen, Hsinchu (TW); Tsung-Chieh Hsiao, Changhua County (TW); Ying-Yao Lai, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 222 days.

(21) Appl. No.: 17/397,400

(22) Filed: Aug. 9, 2021

(65) Prior Publication Data
US 2022/0359644 A1 Nov. 10, 2022

Related U.S. Application Data

(60) Provisional application No. 63/185,181, filed on May 6, 2021.

(51) Int. Cl.
*H01L 23/522* (2006.01)
*H01L 23/00* (2006.01)
(Continued)

(52) U.S. Cl.
CPC .......... *H01L 28/88* (2013.01); *H01L 23/5223* (2013.01); *H01L 24/05* (2013.01);
(Continued)

(58) Field of Classification Search
CPC ..... H01L 28/88; H01L 23/5223; H01L 24/05; H01L 28/87; H01L 2224/02181;
(Continued)

(56) References Cited

U.S. PATENT DOCUMENTS 6,506,981 B1 * 1/2003 Liberkowski ....... H01L 23/5382
174/262
7,122,131 B2 * 10/2006 Satou ...................... H01B 1/16
156/89.18
(Continued)

FOREIGN PATENT DOCUMENTS

JP 2005142531 A 6/2005
KR 20060062364 A 6/2006
(Continued)

OTHER PUBLICATIONS

JP 2007184324 (Year: 2007).*
(Continued)

*Primary Examiner* — Ahmed N Sefer
(74) *Attorney, Agent, or Firm* — Haynes and Boone, LLP

(57) ABSTRACT

A semiconductor device includes first and second metal-insulator-metal structures. The first metal-insulator-metal structure includes a first bottom conductor plate, a first portion of a first dielectric layer, a first middle conductor plate, a first portion of a second dielectric layer, and a first top conductor plate stacked up one over another. The second metal-insulator-metal structure includes a second bottom conductor plate, a second portion of the first dielectric layer, a second middle conductor plate, a second portion of the second dielectric layer, and a second top conductor plate stacked up one over another. In a cross-sectional view, the first bottom conductor plate is wider than the first middle conductor plate that is wider than the first top conductor plate, and the second bottom conductor plate is narrower than the second middle conductor plate that is narrower than the first top conductor plate.

20 Claims, 14 Drawing Sheets

(51) Int. Cl.
*H01L 27/01* (2006.01)
*H01L 49/02* (2006.01)

(52) U.S. Cl.
CPC .............. *H01L 27/01* (2013.01); *H01L 28/40* (2013.01); *H01L 28/87* (2013.01); *H01L 24/13* (2013.01); *H01L 2224/02181* (2013.01); *H01L 2224/05018* (2013.01); *H01L 2224/05559* (2013.01)

(58) Field of Classification Search
CPC . H01L 2224/05018; H01L 2224/05559; H01L 24/13
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,627,312 B2 * | 4/2017 | Childs | H01L 23/5226 |
| 10,461,148 B1 * | 10/2019 | Reznicek | H01L 29/66181 |
| 2005/0082639 A1 | 4/2005 | Kikuta et al. | |
| 2006/0118907 A1 | 6/2006 | Park | |
| 2012/0306089 A1 * | 12/2012 | Freeman | H10B 43/27 257/773 |
| 2013/0161821 A1 * | 6/2013 | Hwang | H10B 43/27 257/E21.585 |
| 2013/0258545 A1 * | 10/2013 | Yano | H01G 4/306 361/301.4 |
| 2014/0159200 A1 | 6/2014 | Loke | |
| 2019/0206727 A1 * | 7/2019 | Matovu | H01L 21/31051 |
| 2019/0259698 A1 | 8/2019 | Takahashi et al. | |
| 2019/0304935 A1 * | 10/2019 | Collins | H01L 21/4857 |
| 2020/0006183 A1 | 1/2020 | Huang | |
| 2020/0035779 A1 | 1/2020 | Huang et al. | |
| 2020/0211981 A1 * | 7/2020 | Kothari | H01L 23/564 |
| 2021/0005392 A1 * | 1/2021 | Lee | H01G 4/008 |
| 2022/0302019 A1 * | 9/2022 | Chen | H01L 23/5223 |
| 2023/0017938 A1 * | 1/2023 | Lee | H01L 21/32139 |

FOREIGN PATENT DOCUMENTS

| | | |
|---|---|---|
| KR | 20070028392 A | 3/2007 |
| KR | 20100041220 A | 4/2010 |
| WO | 2005122245 A2 | 12/2005 |

OTHER PUBLICATIONS

Hsiao, Yuna-Yang et al., "Metal-Insulator-Metal Structures," U.S. Appl. No. 16/802,246, filed Feb. 26, 2020, Assignee: Taiwan Semiconductor Manufacturing Co., Ltd., 28 pages specification, 21 sheets of drawings.

* cited by examiner

METAL-INSULATOR-METAL STRUCTURE

PRIORITY

This application claims priority of and benefits to U.S. Provisional Application Ser. No. 63/185,181, filed May 6, 2021, herein incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

As the geometry size of IC devices decreases, passive devices that require large surface areas are moved to back-end-of-line (BEOL) structures. Metal-Insulator-Metal (MIM or MiM) capacitors are among examples of such passive devices. A typical MIM capacitor includes multiple conductor plate layers that are insulated from one another by multiple insulator layers. Although existing MIM structures and the fabrication process thereof have been generally adequate for their intended purposes, they have not been entirely satisfactory in every aspect. It is desirable to more effectively utilize the plate areas to increase provided capacitance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
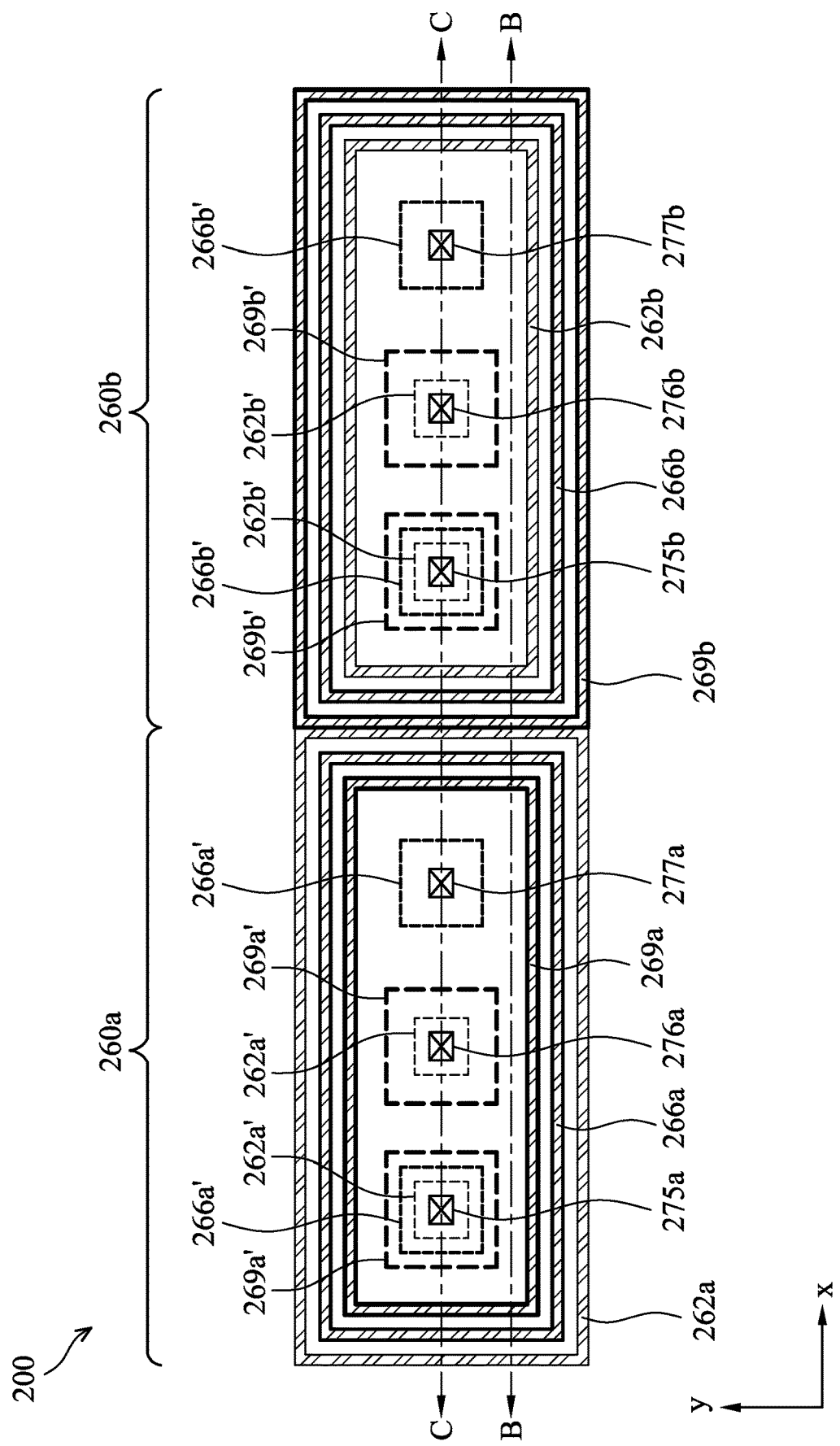
FIG. 1A is a top schematic view of a semiconductor device having an MIM structure in accordance with embodiments of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments, in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

Metal-Insulator-Metal (MIM) capacitors have been widely used in integrated circuits such as mixed signal circuits, analog circuits, Radio Frequency (RF) circuits, Dynamic Random Access Memories (DRAMs), embedded DRAMs, and other types circuits. In system-on-chip (SOC) applications, different capacitors for different circuits are integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, an MIM capacitor includes a sandwich structure of interleaving metal layers and insulator layers. An example MIM capacitor includes a bottom conductor plate (such as a bottom metal plate), a middle conductor plate (such as a middle metal plate) over the bottom conductor plate, and a top conductor plate (such as a top metal plate) over the middle conductor plate, each of which is insulated from an adjacent conductor plate by an insulator layer. In the present embodiment, a conductor plate refers to a portion of a conductor layer, and a metal plate refers to a portion of a metal layer.

As an MIM capacitor is fabricated in a back-end-of-line (BEOL) structure to provide a large surface area, its conductor plates extend over multiple lower contact features. Contact vias may be formed through the conductor plates to electrically couple the lower contact features to upper contact features, such as contact pads, for connection to external circuitry. Contact vias may penetrate the conductor plates in at least three scenarios. In the first scenario, a contact via extends through the conductor plates without electrically coupling to any of the conductor plates. The contact via in the first scenario may be for logic drive signals and may be referred to as a logic contact via. In the second scenario, a contact via extends through the conductor plates and is electrically coupled to the middle conductor plate and is electrically isolated from the top conductor plate and the bottom conductor plate. The contact via in the second scenario may be referred to a middle plate (MP) contact via. In the third scenario, a contact via extends through the conductor plates and is electrically coupled to the top conductor plate and the bottom conductor plate and is insulated from the middle conductor plate. The contact via in the third scenario may be referred to a top plate-bottom plate (TPBP) contact via. The MP contact via and the TPMP contact via provide access to capacitance between the middle conductor plate, on the one hand, and the top conductor plate and the bottom conductor plate, on the other hand.

In some approaches, MIM plate structures adopt a bottom-up plate enclosure throughout the whole chip or SOC. For example, throughout the whole chip or SOC, each MIM structure has its bottom conductor plate wider than its middle conductor plate which is wider than its top conductor plate. In such approaches, the bottom conductor plates and spacing between the adjacent bottom conductor plates dominate the total size of the MIM plate structures. Spacing between the adjacent bottom conductor plates is necessary to conform to the design rules and spacing between the adjacent top conductor plates is not fully utilized. In some other approaches, MIM plate structures adopt a top-down plate enclosure throughout the whole chip or SOC, which is the direct opposite of the bottom-up plate enclosure. In other words, throughout the whole chip or SOC, each MIM structure has its bottom conductor plate narrower than its middle conductor plate which is narrower than its top conductor plate. In these approaches, the top conductor plates and spacing between the adjacent top conductor plates dominate the total size of the MIM plate structures. Spacing between the adjacent top conductor plates is necessary to conform to the design rules and spacing between the adjacent bottom conductor plates is not fully utilized. The MIM plate structures in these approaches are relatively large.

Figure 1B:
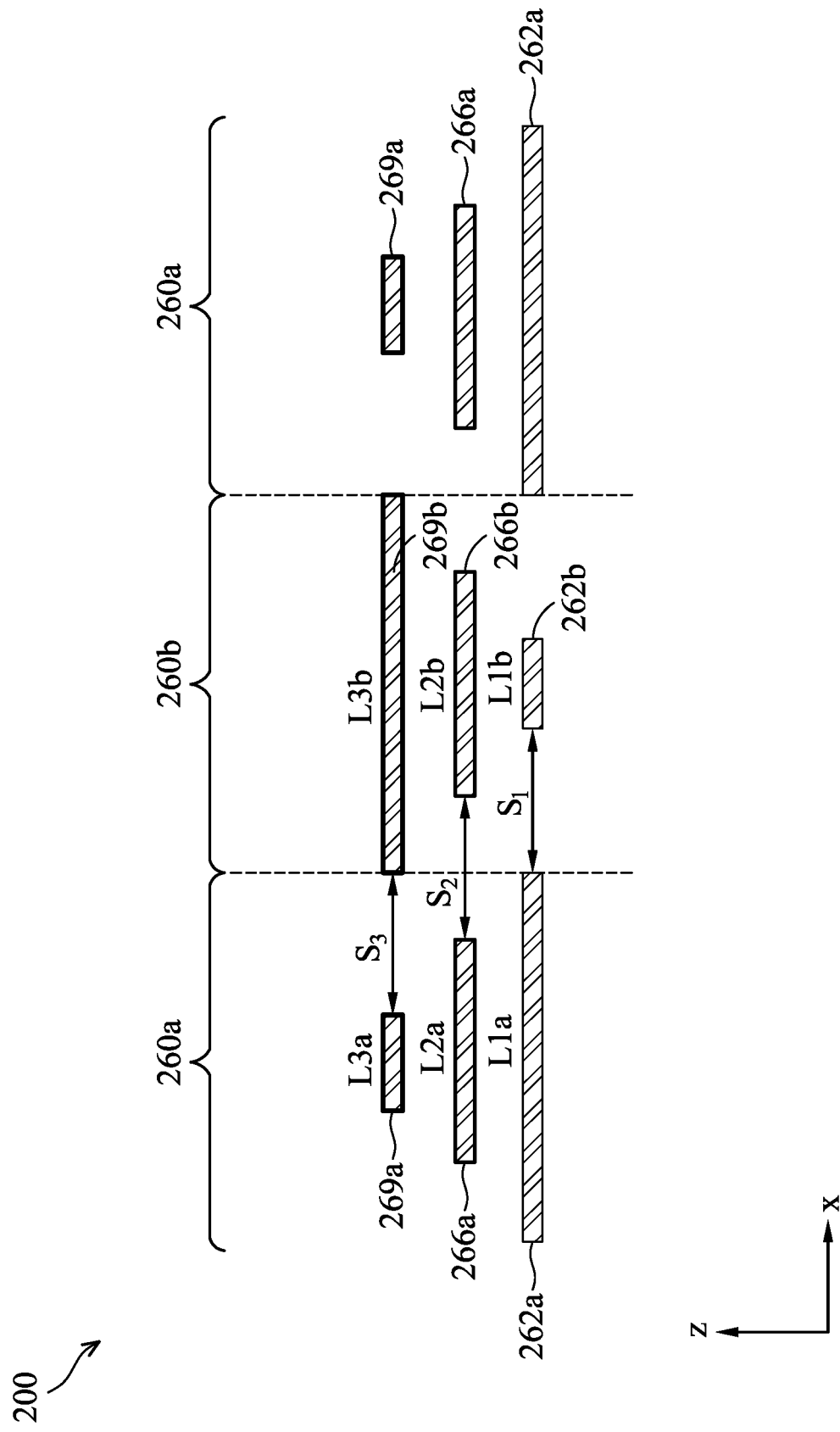
FIG. 1B is a cross-sectional schematic view of the semiconductor device in FIG. 1A along the B-B line in FIG. 1A, according to an embodiment of the present disclosure.
Figure 1C:
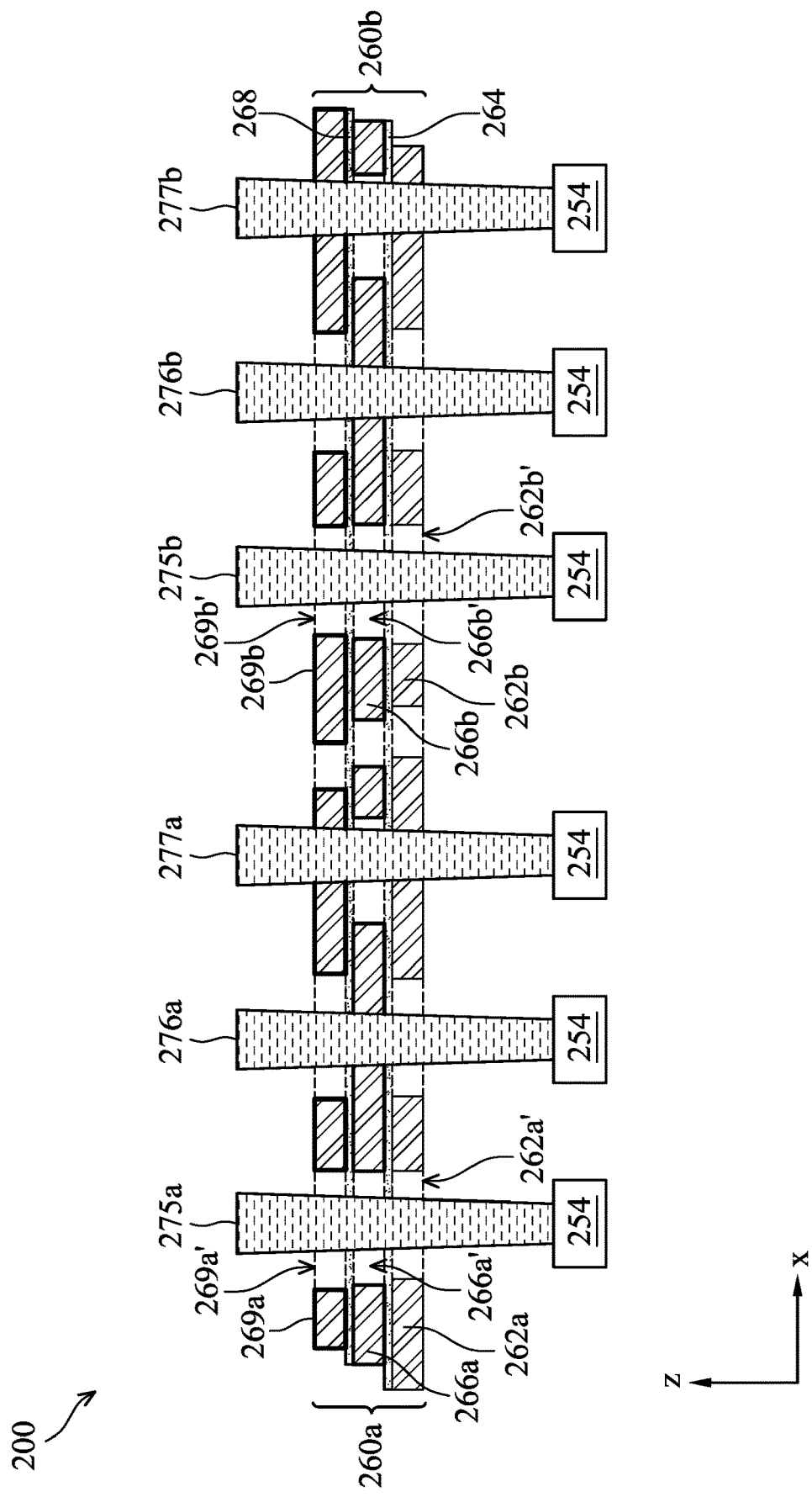
FIG. 1C is a cross-sectional schematic view of the semiconductor device in FIG. 1A along the C-C line in FIG. 1A, according to an embodiment of the present disclosure.

The present disclosure uses a Tetris-like or puzzle-like conductor plate structure to fully utilize all possible effective MIM area, which achieves about 1.3 times capacitance increase under the same MIM footprint compared to the approaches discussed above. An example semiconductor device 200 according to the present disclosure is shown in FIGS. 1A, 1B, and 1C. Referring to FIGS. 1A, 1B, and 1C collectively, the semiconductor device 200 includes one or more first MIM structures 260a (two shown in FIG. 1B) and one or more second MIM structures 260b (one shown in FIG. 1B). As shown in FIGS. 1A and 1B, the first MIM structure 260a uses a bottom-up construction wherein its bottom conductor plate 262a is wider (along the "y" direction) and longer (along the "x" direction) than the middle conductor plate 266a which is in turn wider and longer than the top conductor plate 269a. In contrast, the second MIM structure 260b uses a top-down construction wherein its bottom conductor plate 262b is narrower (along the "y" direction) and shorter (along the "x" direction) than its middle conductor plate 266b which is in turn narrower and shorter than its top conductor plate 269b. In an embodiment, each of the conductor plates 262a, 266a, 269a, 262b, 266b, and 269b includes a metal or a metal nitride such as TiN and has a thickness about 350 Å to 450 Å.

Figure 12:
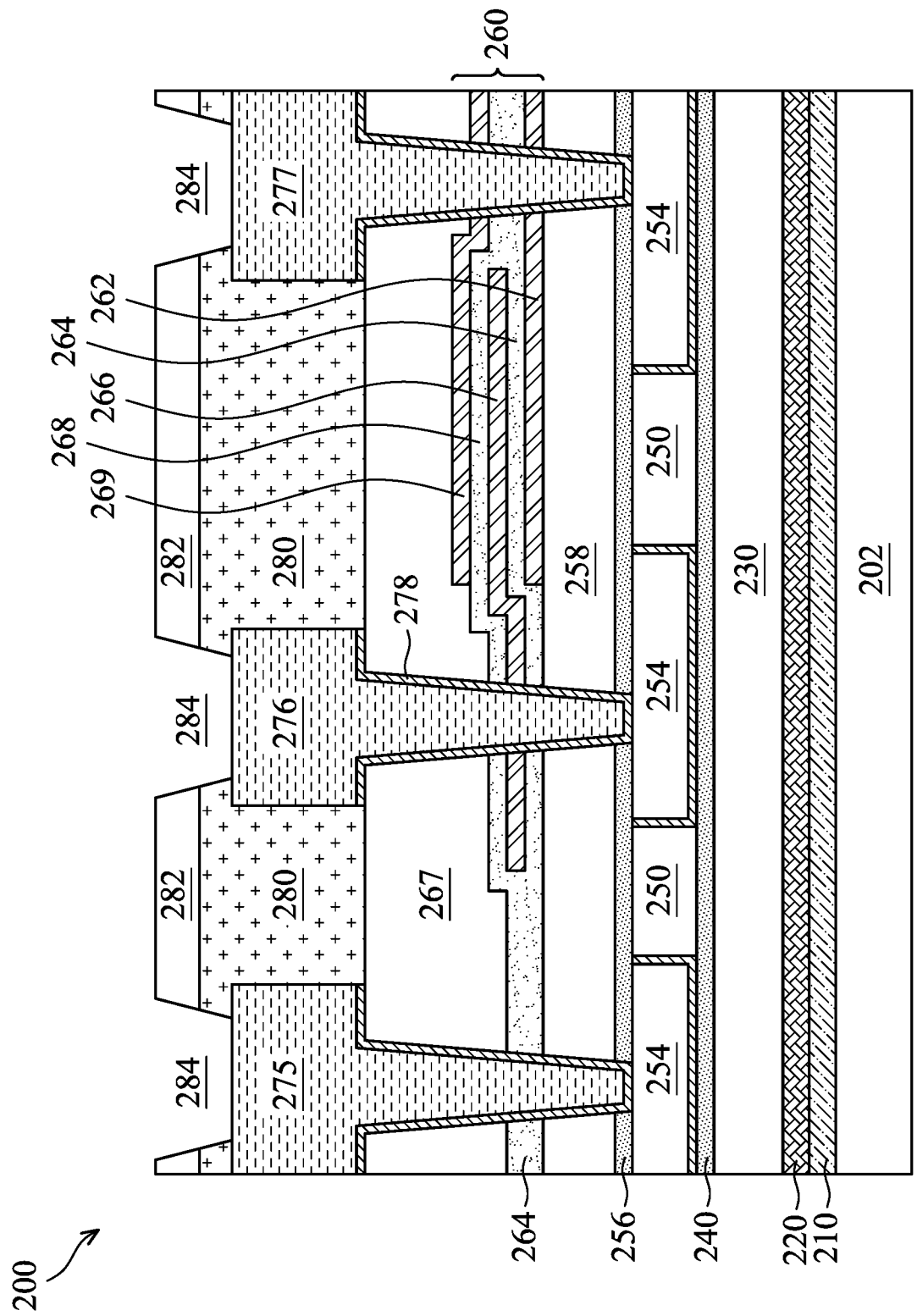

As shown in FIGS. 1C and 12, each of the MIM structures 260a and 260b includes an insulator layer 264 between the bottom and the middle conductor plates and an insulator layer 268 between the middle and the top conductor plates. For purpose of simplicity, the insulator layers are not shown in FIGS. 1A, and 1B. In an embodiment, the insulator layer 264 is disposed between the bottom conductor plate 262a and the middle conductor plate 266a and between the bottom conductor plate 262b and the middle conductor plate 266b, and the insulator layer 264 includes a triple layer stack having a first layer of zirconium oxide ($ZrO_2$) over a first layer of aluminum oxide ($Al_2O_3$) that is over a second layer of zirconium oxide ($ZrO_2$). Each of the first and the second layers of $ZrO_2$ may have a thickness about 20 Å to 100 Å, and the first layer of $Al_2O_3$ may have a thickness about 20 Å to 100 Å. In a further embodiment, the insulator layer 268 is disposed between the middle conductor plate 266a and the top conductor plate 269a and between the middle conductor plate 266b and the top conductor plate 269b, and the insulator layer 268 includes a triple layer stack having a third layer of $ZrO_2$ over a second layer of $Al_2O_3$ that is over a fourth layer of $ZrO_2$. Each of the third and the fourth layers of $ZrO_2$ may have a thickness about 20 Å to 100 Å, and the second layer of $Al_2O_3$ may have a thickness about 20 Å to 100 Å.

In an embodiment, the bottom conductor plates 262a may have different widths and lengths among different first MIM structures 260a (such as the leftmost 260a and the rightmost 260a in FIG. 1B), the middle conductor plates 266a may have different widths and lengths among different first MIM structures 260a, and the top conductor plates 269a may have different widths and lengths among different first MIM structures 260a. Similarly, the bottom conductor plates 262b may have different widths and lengths among different second MIM structures 260b, the middle conductor plates 266b may have different widths and lengths among different second MIM structures 260b, and the top conductor plates 269b may have different widths and lengths among different second MIM structures 260b.

Referring to FIG. 1B, in an embodiment, a first MIM structure 260a is arranged next to a second MIM structure 260b without any other MIM structure(s) in between. The bottom conductor plate 262a of the first MIM structure 260a is spaced from the bottom conductor plate 262b of the second MIM structure 260b by a distance $S_1$. The middle conductor plate 266a of the first MIM structure 260a is spaced from the middle conductor plate 266b of the second MIM structure 260b by a distance $S_2$. The top conductor plate 269a of the first MIM structure 260a is spaced from the top conductor plate 269b of the second MIM structure 260b by a distance $S_3$. In an embodiment, the distances $S_1$, $S_2$, and $S_3$ are substantially equal. In an embodiment, each of the distances $S_1$, $S_2$, and $S_3$ is designed to be the minimum spacing between conductor plates according to the design rules for manufacturing the semiconductor device 200. In an embodiment, each of the distances $S_1$, $S_2$, and $S_3$ is in a range of about 0.2 μm to 10 μm. The above distances $S_1$, $S_2$, and $S_3$ are shown along the "x" direction in this embodiment. In a further embodiment, a first MIM structure 260a is arranged next to a second MIM structure 260b along the "y" direction and the corresponding conductor plates are spaced from each by the distances $S_1$, $S_2$, and $S_3$ along the "y" direction.

In an embodiment, the sum of the length $L_{1a}$ of a bottom conductor plate 262a and the length $L_{1b}$ of an adjacent bottom conductor plate 262b is about equal to the sum of the length $L_{2a}$ of a middle conductor plate 266a and the length $L_{2b}$ of an adjacent middle conductor plate 266b which is in turn about equal to the sum of the length $L_{3a}$ of a top conductor plate 269a and the length $L_{3b}$ of an adjacent top conductor plate 269b. In an embodiment, the sum of the width of a bottom conductor plate 262a and the width of an adjacent bottom conductor plate 262b is about equal to the sum of the width of a middle conductor plate 266a and the width of an adjacent middle conductor plate 266b which is in turn about equal to the sum of the width of a top conductor plate 269a and the width of an adjacent top conductor plate 269b. In the above discussion, a width refers to the dimension along the "y" direction, and a length refers to the dimension along the "x" direction. In an alternative embodiment, a width refers to the dimension along the "x" direction, and a length refers to the dimension along the "y" direction.

In an embodiment, an edge of a bottom conductor plate 262a of a first MIM structure 260a and an edge of a top conductor plate 269b of a second MIM structure 260b are aligned or substantially aligned vertically (along the "z" direction in FIG. 1B). Thus, for the three MIM structures 260a, 260b, and 260a shown in FIG. 1B, the total length along the "x" direction is $L_{1a}+L_{3b}+L_{1a}$. In contrast, using other approaches where both the MIM structures use a bottom-up or a top-down plate enclosure, the total length of the three MIM structures would be $L_{1a}+L_{3b}+L_{1a}+2S_1$. Thus, the MIM structures according to the present embodiment more fully utilizes the space between the horizontally adjacent conductor plates and has a smaller footprint than other approaches for the same amount of capacitance. Stated differently, for the same footprint or wafer area, the MIM structures according to the present embodiment provide more capacitance than other approaches.

Referring to FIGS. 1A and 1C, the semiconductor device 200 includes various openings in the conductor plates. Specifically, the semiconductor device 200 includes openings 262a' in the bottom conductor plates 262a, openings 266a' in the middle conductor plates 266a, openings 269a' in the top conductor plates 269a, openings 262b' in the bottom conductor plates 262b, openings 266b' in the middle conductor plates 266b, and openings 269b' in the top conductor plates 269b. The various openings are schematically illustrated with dotted boxes in FIG. 1A and dashed lines in FIG. 1C. The openings are not shown in FIG. 1B because the B-B line does not go through any of the openings.

Referring to FIGS. 1A and 1C, the semiconductor device 200 further includes various plugs that go through the openings (i.e., the plugs penetrate through the conductor plates). Specifically, the semiconductor device 200 includes plugs 275a, 276a, and 277a that penetrate through the conductor plates 262a, 266a, and 269a, and plugs 275b, 276b, and 277b that penetrate through the conductor plates 262b, 266b, and 269b. As shown in FIG. 1C, the plug 275a is electrically insulated from the conductor plates 262a, 266a, and 269a, the plug 276a is electrically connected to the middle conductor plate 266a and is electrically insulated from the bottom and top conductor plates 262a and 269a, and the plug 277a is electrically connected to the bottom and top conductor plates 262a and 269a and is electrically insulated from the middle conductor plate 266a. Thus, the plug 275a is a logic contact via, the plug 276a is an MP contact via, and the plug 277a is a TPMP contact via. Similarly, the plug 275b is electrically insulated from the conductor plates 262b, 266b, and 269b, the plug 276b is electrically connected to the middle conductor plate 266b and is electrically insulated from the bottom and top conductor plates 262b and 269b, and the plug 277b is electrically connected to the bottom and top conductor plates 262b and 269b and is electrically insulated from the middle conductor plate 266b. Thus, the plug 275b is a logic contact via, the plug 276b is an MP contact via, and the plug 277b is a TPMP contact via. The various plugs are disposed on lower contact features 254 that are disposed in a dielectric layer (not shown in FIG. 1C) of the semiconductor device 200.

Figure 2:
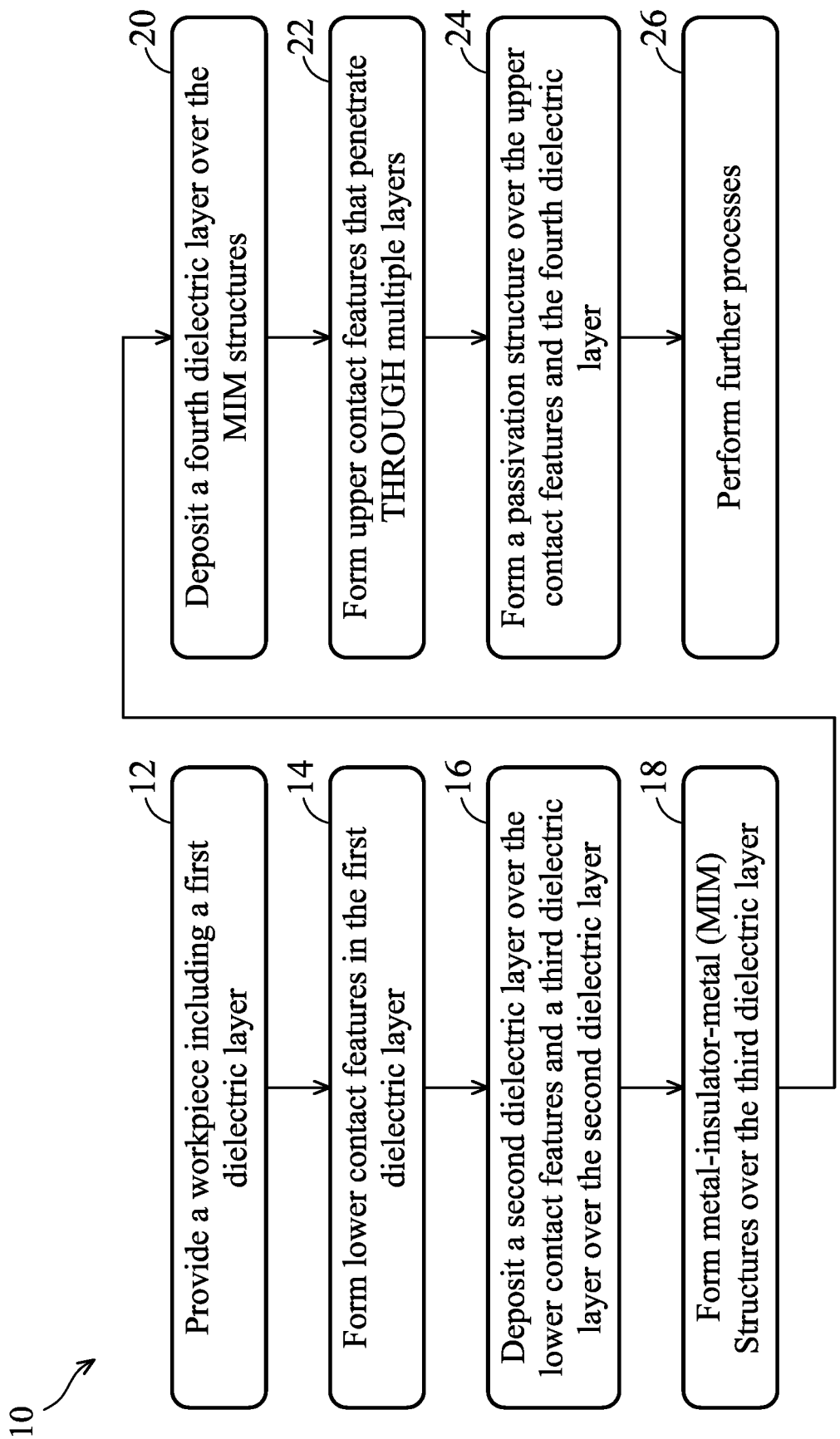
FIG. 2 is a flow chart of a method for fabricating a semiconductor device in accordance with embodiments of the present disclosure.

FIG. 2 is a flowchart illustrating a method 10 for fabricating a semiconductor device 200 according to embodiments of the present disclosure. The method 10 is merely an example and is not intended to limit the present disclosure to what is explicitly illustrated in the method 10. Additional steps can be provided before, during, and after the method 10, and some steps described can be replaced, eliminated, or moved around for additional embodiments of the method. Not all steps are described herein in detail for reasons of simplicity. The method 10 is described below in conjunction with FIGS. 3-12, which are diagrammatic fragmentary cross-sectional views of the semiconductor device 200 at different stages of fabrication according to embodiments of the present disclosure.

Figure 3:
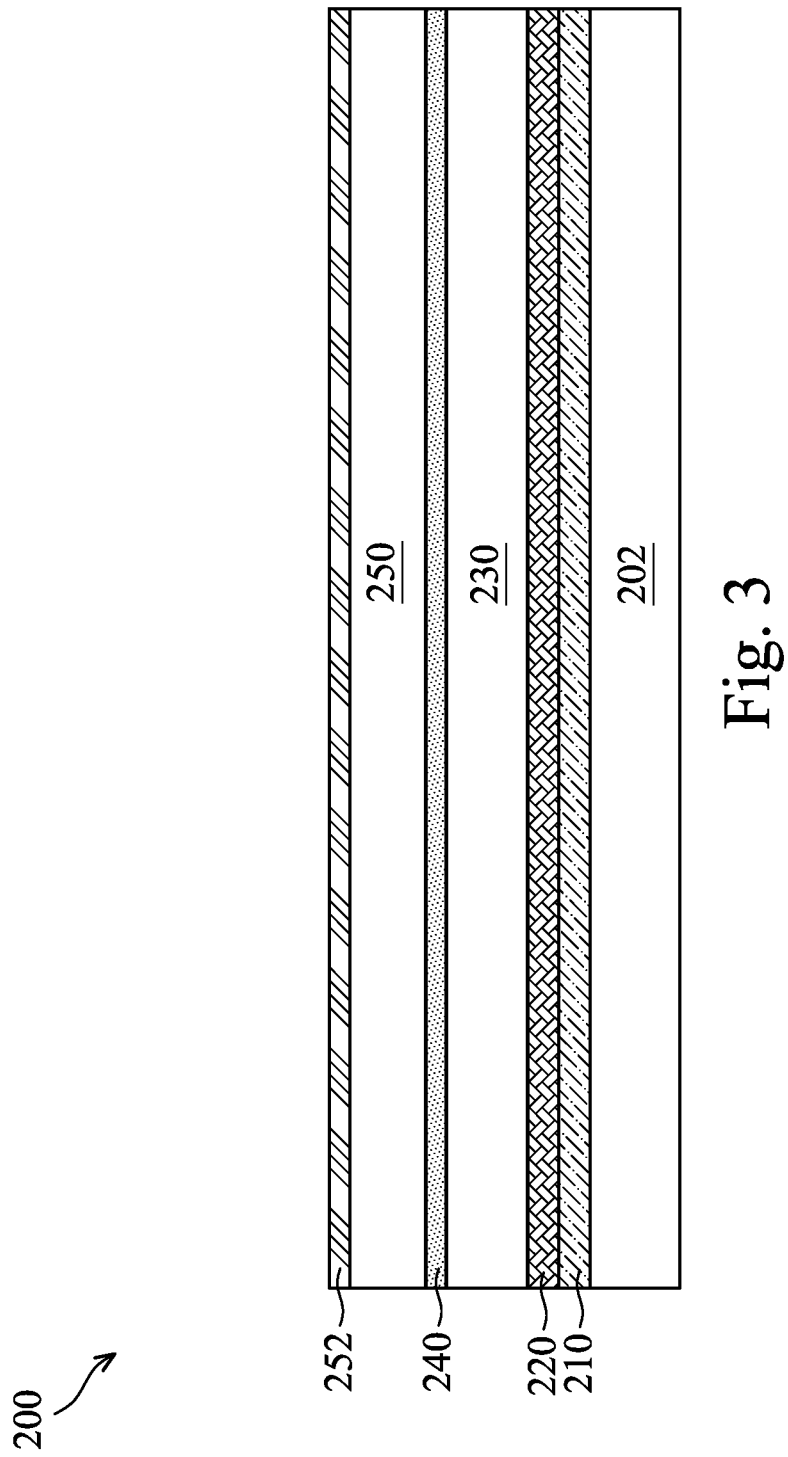
FIGS. 3, 4, 5, 6, 7, 8, 9, 10, 11, and 12 are cross-sectional views of a semiconductor device at various stages of fabrication according to embodiments of the present disclosure.

Referring to FIGS. 2 and 3, method 10 includes a block 12 where a workpiece (or an intermediate structure) of the semiconductor device 200 is provided. The semiconductor device 200 at this stage includes various layers already formed thereon. The semiconductor device 200 includes a substrate 202, which may include silicon or other semiconductor materials such as germanium. The substrate 202 also may include a compound semiconductor such as silicon carbide, gallium arsenic, indium arsenide, or indium phosphide. In some embodiments, the substrate 202 may include alloy semiconductor such as silicon germanium, silicon germanium carbide, gallium arsenic phosphide, or gallium indium phosphide. In some embodiments, the substrate 202 may include an epitaxial layer, for example an epitaxial layer overlying a bulk semiconductor. Various microelectronic components may be formed in or on the substrate 202, such as transistor components including source/drains, gates, gate spacers, source/drain contacts, gate contacts, isolation structures including shallow trench isolation (STI), or any other suitable components.

The semiconductor device 200 also includes an interconnect layer 210. The interconnect layer 210 may be one of the interconnect layers in a multi-layered interconnect (MLI) structure, which is formed over the substrate 202 and may include multiple patterned dielectric layers and conductive layers that provide interconnections (e.g., wiring) between the various microelectronic components of the semiconductor device 200. There may be intermediate layers or components between the interconnect layer 210 and the substrate 202, but in the interest of simplicity such layers or components are not shown. In an embodiment, the interconnect layer 210 is about 160 nm to about 230 nm thick.

The interconnect layer 210 may include multiple conductive components as well as an interlayer dielectric (ILD) component that partially or fully surrounds the conductive components. The conductive components may include contacts, vias, or metal lines. The ILD component may be a silicon oxide or silicon oxide containing material where silicon exists in various suitable forms. As an example, the ILD component includes silicon oxide or a low-k dielectric material whose k-value (dielectric constant) is smaller than that of silicon oxide, which is about 4. In some embodiments, the low-k dielectric material includes a porous organosilicate thin film such as SiOCH, tetraethylorthosilicate (TEOS) formed oxide, un-doped silicate glass, doped silicon oxide such as borophosphosilicate glass (BPSG), fluorosilicate glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon-based polymeric dielectrics, or combinations thereof.

In an embodiment, a carbide layer 220 is deposited on the interconnect layer 210. The deposition process includes chemical vapor deposition (CVD), physical vapor deposition (PVD), atomic layer deposition (ALD), or combinations thereof. In some embodiments, the carbide layer 220 has a generally uniform thickness of about 45 nm to about 70 nm. Any suitable type of carbide material such as silicon carbide (SiC) can be used in the carbide layer 220.

In an embodiment, an oxide layer 230 is deposited on the carbide layer 220. Any suitable deposition process may be used, including CVD, PVD, ALD, or combinations thereof. In some embodiments, the oxide layer 230 includes undoped silicon oxide. The oxide layer 230 may have a thickness about 500 nm to about 700 nm. In an embodiment, the interconnect layer 210, the carbide layer 220 and the oxide layer 230 may be replaced with one or more interconnect structures.

In an embodiment, an etch stop layer (ESL) 240 is deposited on the oxide layer 230. In some embodiments, the ESL 240 is about 45 nm to about 55 nm thick. The ESL 240 may include silicon carbonitride (SiCN), silicon oxycarbide (SiOC), silicon carbide (SiC), silicon oxycarbonitride (SiOCN), or silicon nitride ($Si_3N_4$), or combinations thereof.

A first dielectric layer 250 may be deposited on the etch stop layer 240. In some embodiments, the first dielectric layer 250 includes undoped silica glass (USG) or silicon oxide. In some embodiments, the first dielectric layer 250 is about 800 nm to about 1000 nm thick. A silicon oxynitride (SiON) layer 252 is deposited on the first dielectric layer 250. In some embodiments, the SiON layer 252 is about 55 nm to about 65 nm thick.

Figure 4:
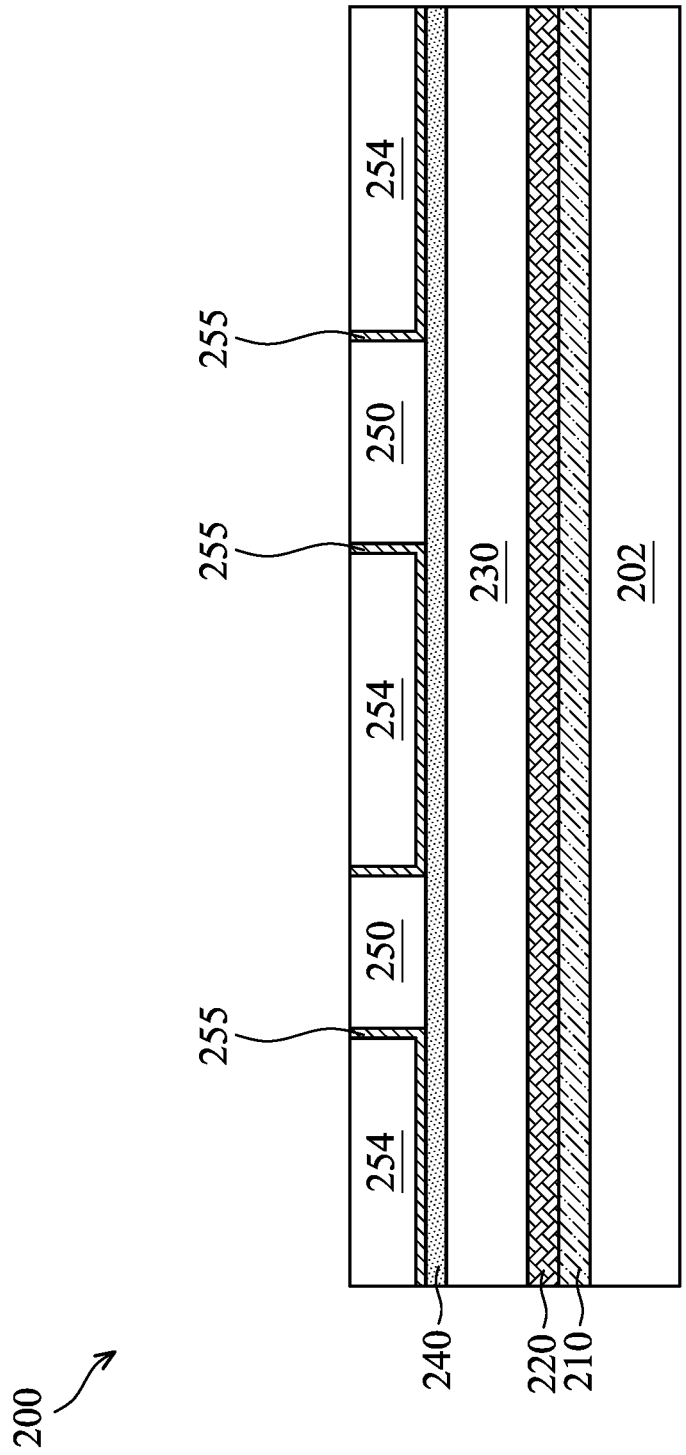

Referring to FIGS. 2 and 4, method 10 includes a block 14 where lower contact features 254 are formed in the first dielectric layer 250. This involves multiple processes. First, the SiON layer 252 is patterned, for example, using a photolithography process. Then, using the patterned SiON layer 252 as an etch mask or as part of an etch mask, the first dielectric layer 250 is etched to form trenches therein. Subsequently, one or more contact features 254 are formed in the trenches of the first dielectric layer 250. The contact features 254 are referred to as lower contact features because they are underneath the MIM structures 260 to be formed thereon. The lower contact features 254 are sometimes also referred to as top metal (TM) contacts because they reside above transistor features (not shown in figures herein) that are formed in or on the substrate 202. The semiconductor device 200 may further include a barrier layer 255 between the first dielectric layer 250 and the contact features 254. In some embodiments, the barrier layer 255 is formed in each of the trenches, followed by the deposition of a metal fill layer over the barrier layer in the trenches. In some embodiments, the barrier layer 255 includes titanium nitride, tantalum, tantalum nitride, or combinations thereof. In some embodiments, the metal fill layer includes a metal or metal alloy such as copper, cobalt, nickel, aluminum, tungsten, titanium, or combinations thereof. In some embodiments, the metal fill layer is formed by deposition or plating, followed by a chemical mechanical planarization (CMP) process to remove excessive material of the metal fill layer. The remaining portions of the metal fill layer post-CMP become the lower contact features 254. In an embodiment, about 5% to about 10% of the thickness of the first dielectric layer 250 is also removed by the CMP process. In an embodiment, the patterned SiON layer 252 is removed during the CMP process. In an alternative embodiment, the patterned SiON layer 252 is removed before the barrier layer 255 is formed.

Figure 5:
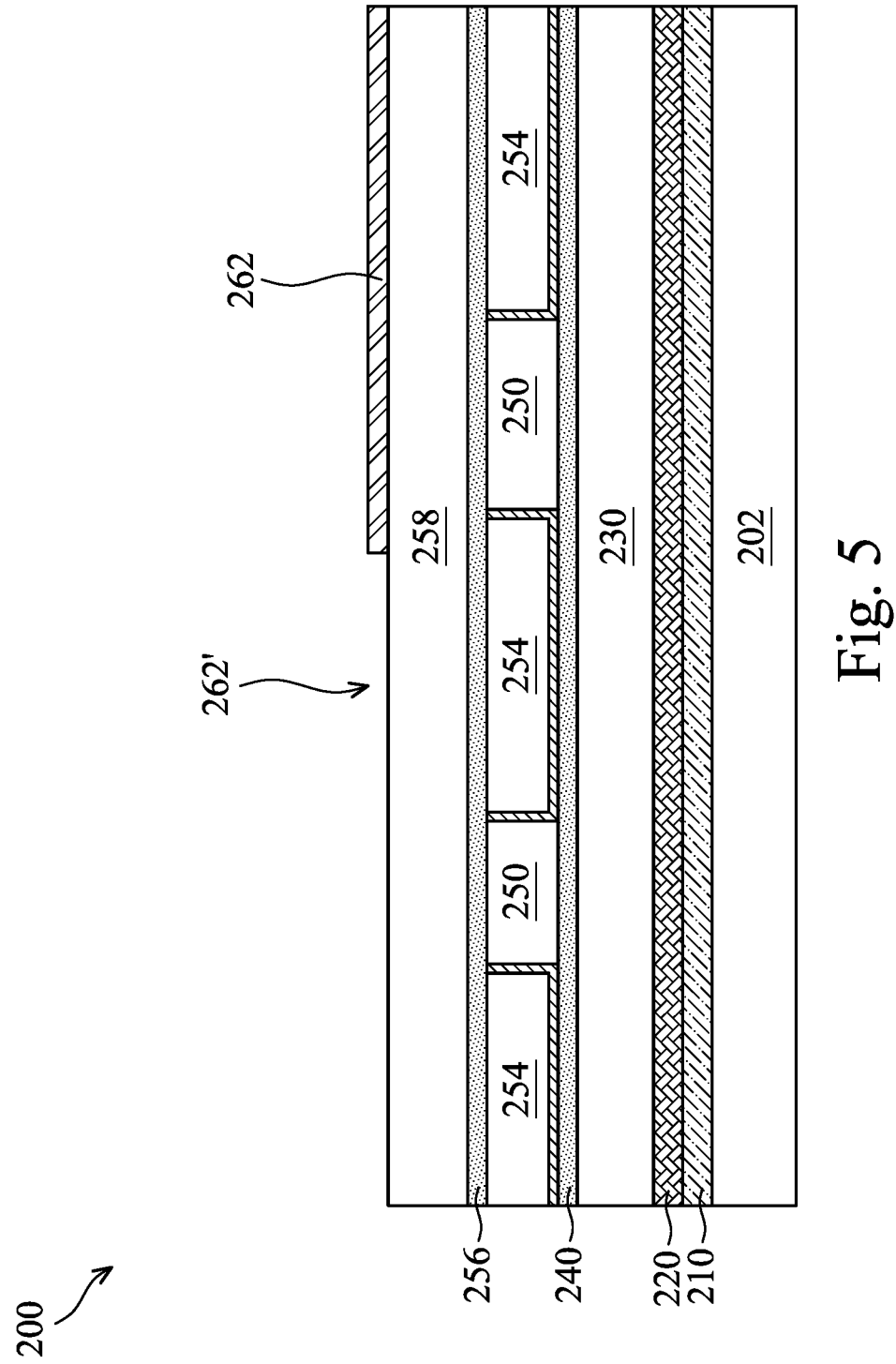

Referring to FIGS. 2 and 5, method 10 includes a block 16 where a second dielectric layer 256 is deposited over the lower contact features 254 and the first dielectric layer 250. In some embodiments, the second dielectric layer 256 is about 70 nm to about 80 nm thick. The second dielectric layer 256 may include silicon carbonitride (SiCN), silicon nitride ($Si_3N_4$), and/or or other suitable materials that may protect the lower contact features 254 from being oxidized. Also, at block 16, a third dielectric layer 258 is deposited over the second dielectric layer 256. In some embodiments, the third dielectric layer 258 is about 200 nm to about 400 nm thick. The third dielectric layer 258 may include an oxide material, such as undoped silica glass (USG), or other suitable material(s).

Referring to FIGS. 2 and 5-9, method 10 includes a block 18 where metal-insulator-metal (MIM) structures 260 (one shown in FIG. 10), such as the MIM structures 260a and 260b discussed above, are formed over the third dielectric layer 258. As shown in FIGS. 5-9, forming the MIM structures 260 involves multiple processes, including those for formation and patterning of a bottom conductor plate layer 262 (or a bottom metal layer 262), a middle conductor plate layer 266 (or a middle metal layer 266), and a top conductor plate layer 269 (or a top metal layer 269). Specifically, the bottom conductor plate layer 262 is patterned into bottom conductor plates such as bottom conductor plates 262a and 262b, the middle conductor plate layer 266 is patterned into middle conductor plates such as middle conductor plates 266a and 266b, and the top conductor plate layer 269 is patterned into top conductor plates such as top conductor plates 269a and 269b.

As shown in FIG. 5, a bottom conductor plate layer 262 is formed on the third dielectric layer 258 and is subsequently patterned to provide multiple bottom conductor plates (including the bottom conductor plates 262a and 262b) and to provide openings 262' (including openings 262a' and 262b' discussed above) in the bottom conductor plates. The bottom conductor plates are collectively referred to as a patterned bottom conductor plate layer 262. In an embodiment, the bottom conductor plate layer 262 is patterned based on a Tetris-like arrangement, such as discussed with reference to FIGS. 1A-1C. The bottom conductor plate layer 262 may include a metal, a metal nitride, or other suitable conductive material. In an embodiment, the bottom conductor plate layer 262 includes TiN and is deposited to about 30 nm to about 50 nm thick. The bottom conductor plate layer 262 may be deposited using any suitable deposition technique including CVD or ALD. The bottom conductor plate layer 262 may be patterned using photolithography and etching processes. For example, a photoresist mask may be formed over the bottom conductor plate layer 262 where the photoresist mask corresponds to the to-be-formed bottom conductor plates. Then, the bottom conductor plate layer 262 is etched (for example, using plasma dry etching) through the photoresist mask to provide the individual bottom conductor plates and the openings 262' in the bottom conductor plates. The photoresist mask is subsequently removed. The patterned bottom conductor plate layer 262 may go through surface treatment such as sidewall passivation using a nitrous oxide ($N_2O$) gas.

Figure 6:
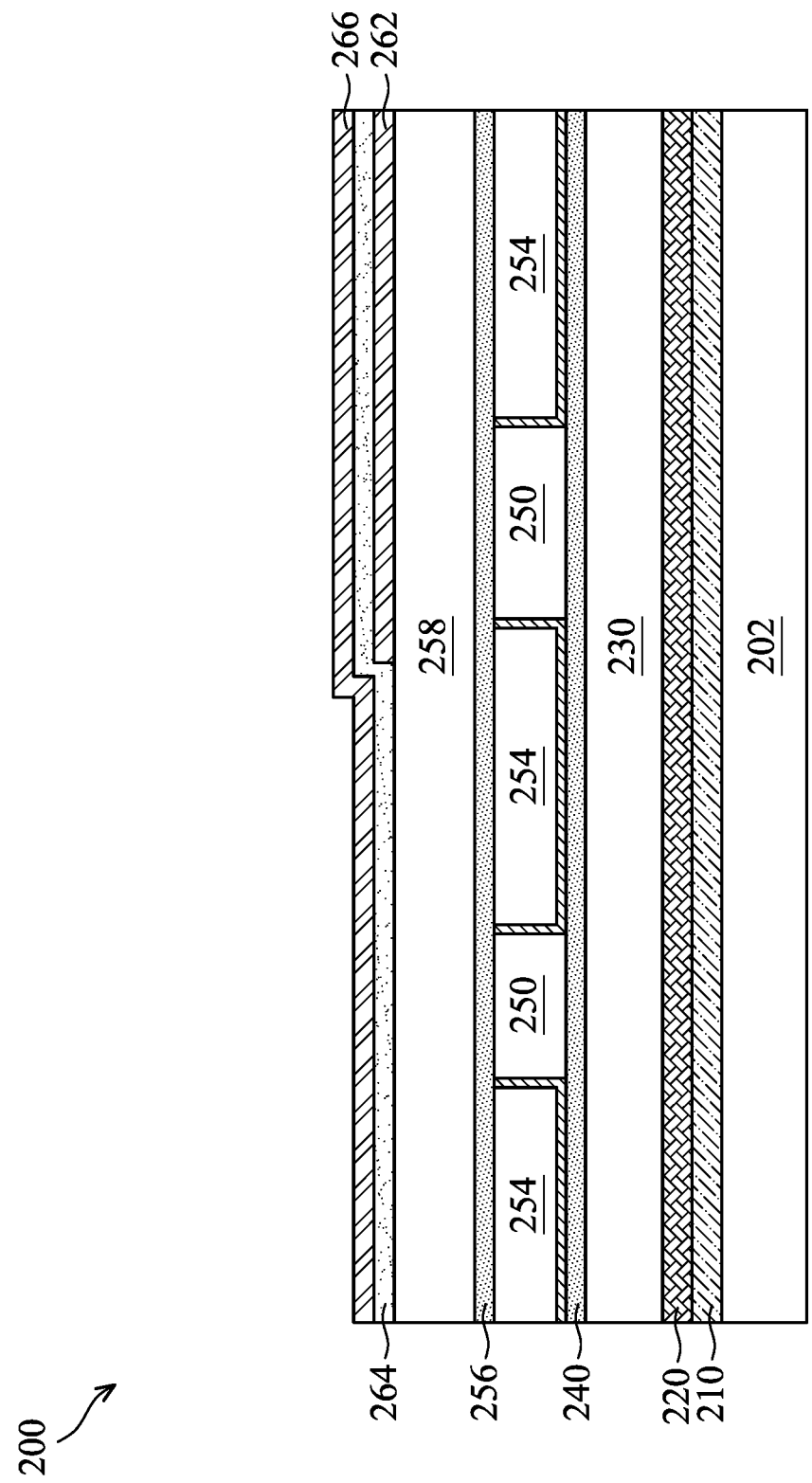

Subsequently, as shown in FIG. 6, a first insulator layer 264 is formed on the patterned bottom conductor plate layer 262. In an embodiment, the first insulator layer 264 is deposited to have a generally uniform thickness over the top surface of the semiconductor device 200 (e.g., having about the same thickness on top and sidewall surfaces of the patterned bottom conductor plate layer 262). In an embodiment, the first insulator layer 264 includes high-k dielectric material(s) whose k-value is greater than that of silicon oxide. For example, the first insulator layer 264 may include a triple layer stack having a layer of $ZrO_2$ over a layer of $Al_2O_3$ that is over another layer of $ZrO_2$. Each of the layers of $ZrO_2$ may have a thickness about 20 Å to 100 Å, and the layer of $Al_2O_3$ may have a thickness about 20 Å to 100 Å. As shown in FIG. 6, the first insulator layer 264 is deposited to fill the openings 262' in the patterned bottom conductor plate layer 262.

Still referring to FIG. 6, a middle conductor plate layer 266 is formed on the first insulator layer 264. The middle conductor plate layer 266 may be formed in a way similar to that used to form the bottom conductor plate layer 262. The middle conductor plate layer 266 may include a metal, a metal nitride, or other suitable conductive material. In an embodiment, the middle conductor plate layer 266 includes TiN and is deposited to about 30 nm to about 50 nm thick.

Figure 7:
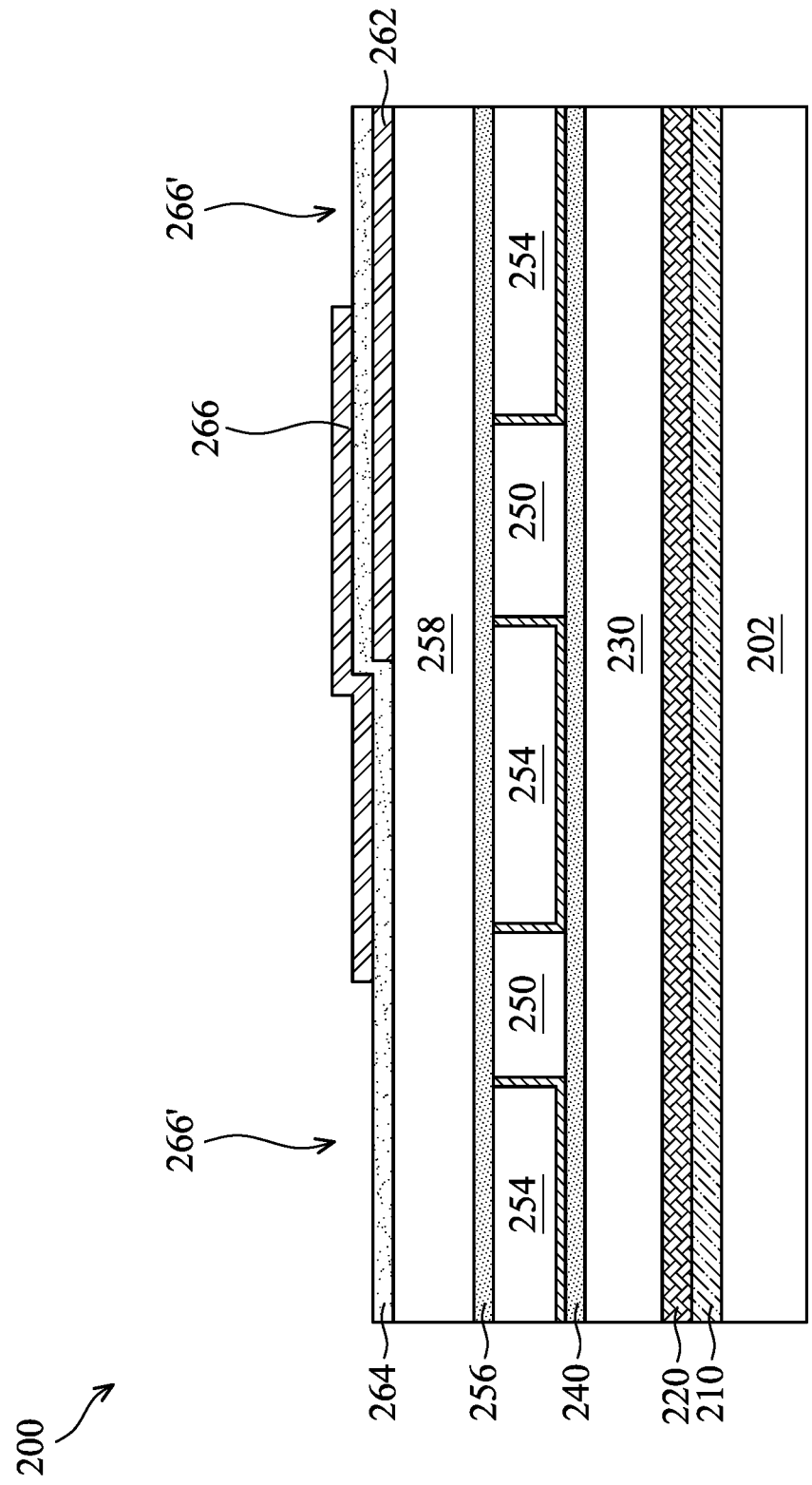

Referring to FIG. 7, the middle conductor plate layer 266 is patterned using photolithography and etching processes to provide multiple middle conductor plates (including the middle conductor plates 266a and 266b) and to provide openings 266' (including openings 266a' and 266b' discussed above) in the middle conductor plates. The middle conductor plates are collectively referred to as a patterned middle conductor plate layer 266. In an embodiment, the middle conductor plate layer 266 is patterned based on a Tetris-like arrangement, such as discussed with reference to FIGS. 1A-1C. The patterned middle conductor plate layer 266 may go through surface treatment such as sidewall passivation using a nitrous oxide ($N_2O$) gas.

Figure 8:
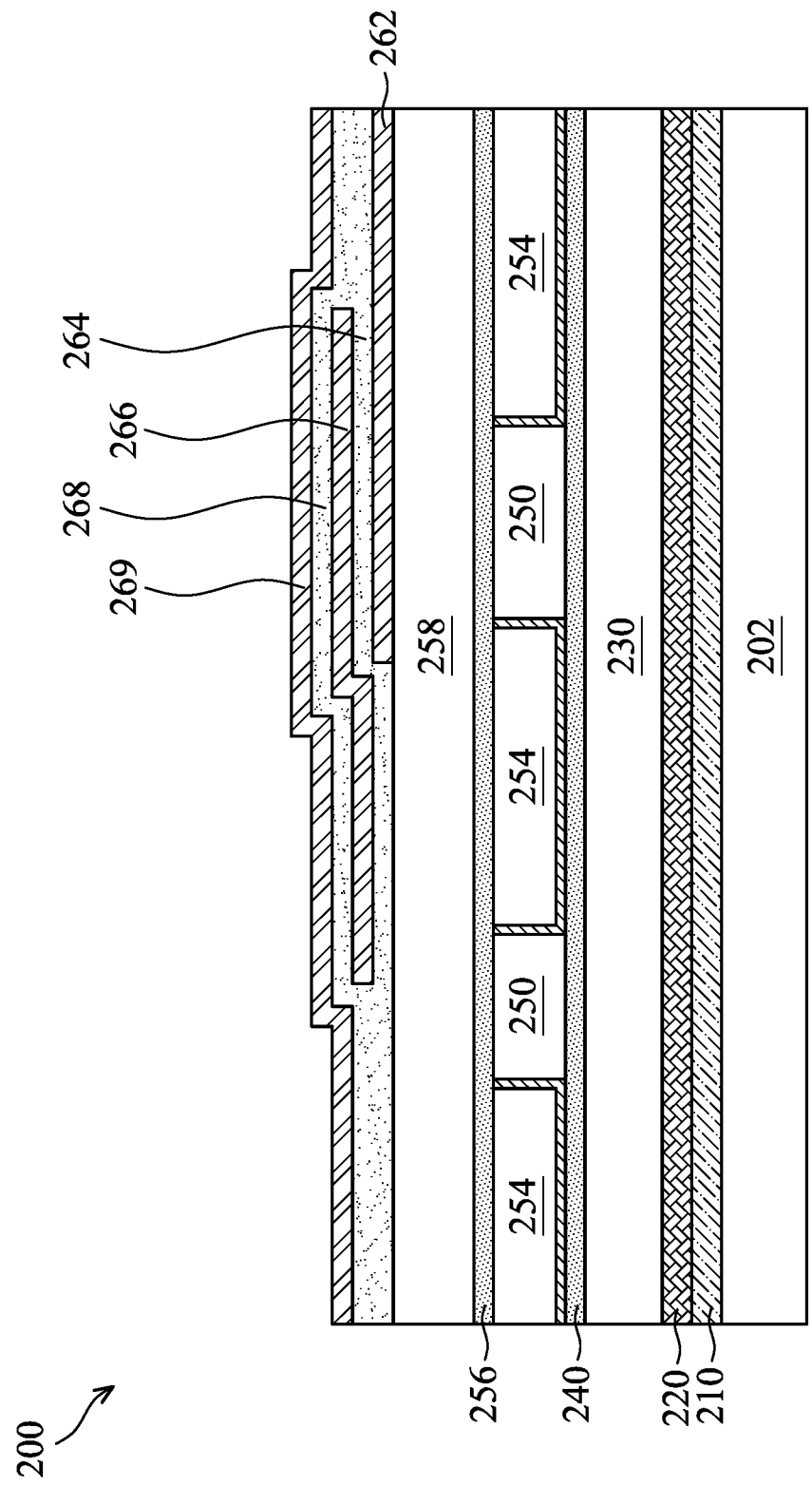

Referring to FIG. 8, a second insulator layer 268 is formed on the patterned middle conductor plate layer 266 and fills the openings 266'. In an embodiment, the second insulator layer 268 is deposited to have a generally uniform thickness over the top surface of the semiconductor device 200 (e.g., having about the same thickness on top and sidewall surfaces of the patterned middle conductor plate layer 266). In an embodiment, the second insulator layer 268 includes high-k dielectric material(s) whose k-value is greater than that of silicon oxide. For example, the second insulator layer 268 may include a triple layer stack having a layer of $ZrO_2$ over a layer of $Al_2O_3$ that is over another layer of $ZrO_2$. Each of the layers of $ZrO_2$ may have a thickness about 20 Å to 100 Å, and the layer of $Al_2O_3$ may have a thickness about 20 Å to 100 Å. In embodiments, the first insulator layer 264 and the second insulator layer 268 may include same or different insulating materials and may have same or different thicknesses.

Still referring to FIG. 8, a top conductor plate layer 269 is formed on the second insulator layer 268. The top conductor plate layer 269 may be formed in a way similar to that used to form the middle conductor plate layer 266 or the bottom conductor plate layer 262. The top conductor plate layer 269 may include a metal, a metal nitride, or other suitable conductive material. In an embodiment, the top conductor plate layer 269 includes TiN and is deposited to about 30 nm to about 50 nm thick. In some embodiments, the bottom conductor plate layer 262, the middle conductor plate layer 266, and the top conductor plate layer 269 may include same or different materials and may have same or different thicknesses.

Figure 9:
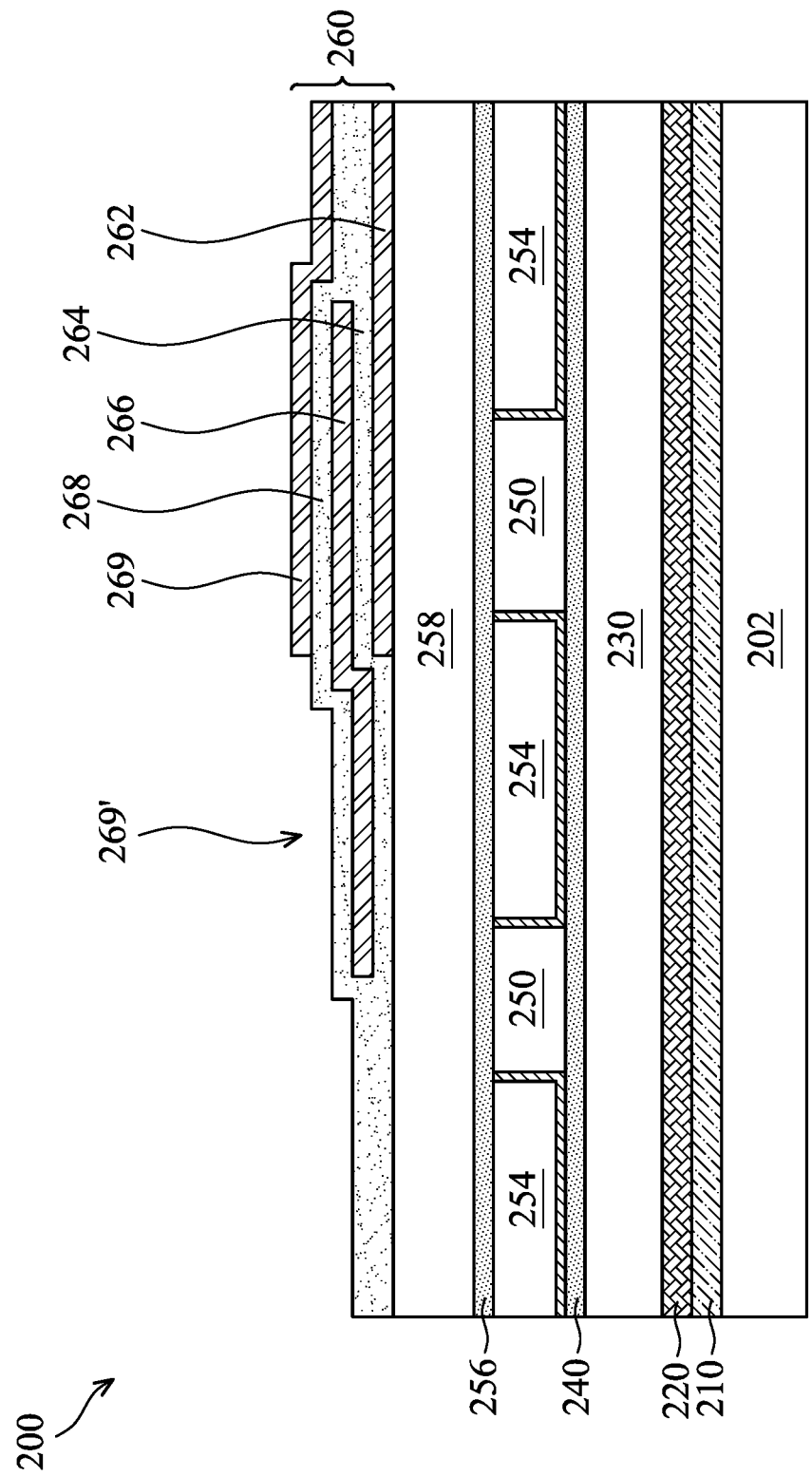

Referring to FIG. 9, the top conductor plate layer 269 is patterned using photolithography and etching processes to provide multiple top conductor plates (including the top conductor plates 269a and 269b) and to provide openings 269' (including openings 269a' and 269b' discussed above) in the top conductor plates. The top conductor plates are collectively referred to as a patterned top conductor plate layer 269. In an embodiment, the top conductor plate layer 269 is patterned based on a Tetris-like arrangement, such as discussed with reference to FIGS. 1A-1C. The patterned top conductor plate layer 269 may go through surface treatment such as sidewall passivation using a nitrous oxide ($N_2O$) gas. The patterned bottom conductor plate layer 262, the first insulator layer 264, the patterned middle conductor plate layer 266, the second insulator layer 268, and the patterned top conductor plate layer 269 collectively form MIM structures 260 over the third dielectric layer 258 over the substrate 202.

Figure 10:
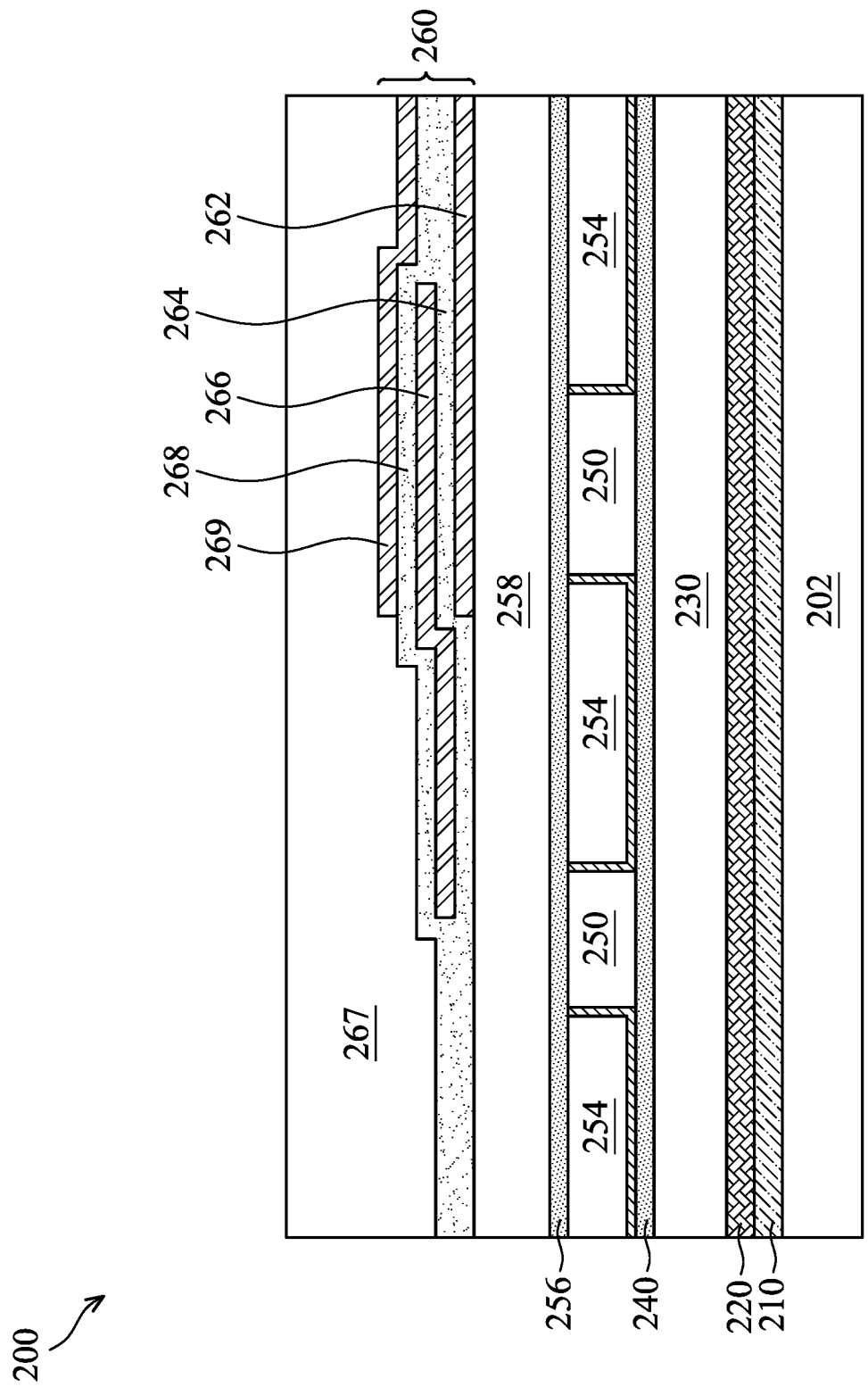

Referring to FIGS. 2 and 10, method 10 includes a block 20 where a fourth dielectric layer 267 is deposited over the MIM structures 260. In some embodiments, the fourth dielectric layer 267 is about 400 nm to about 600 nm thick. In some embodiments, the fourth dielectric layer 267 may include an oxide material, such as undoped silica glass, or other suitable material(s). In some embodiments, the fourth dielectric layer 267 is formed by depositing about 900 nm to about 1000 nm of the oxide material, followed by a CMP process to reach the final thickness. As shown in FIG. 10, the MIM structures 260 are sandwiched between the third dielectric layer 258 and the fourth dielectric layer 267, which may have the same or different materials and the same or different thicknesses in various embodiments.

Figure 11:
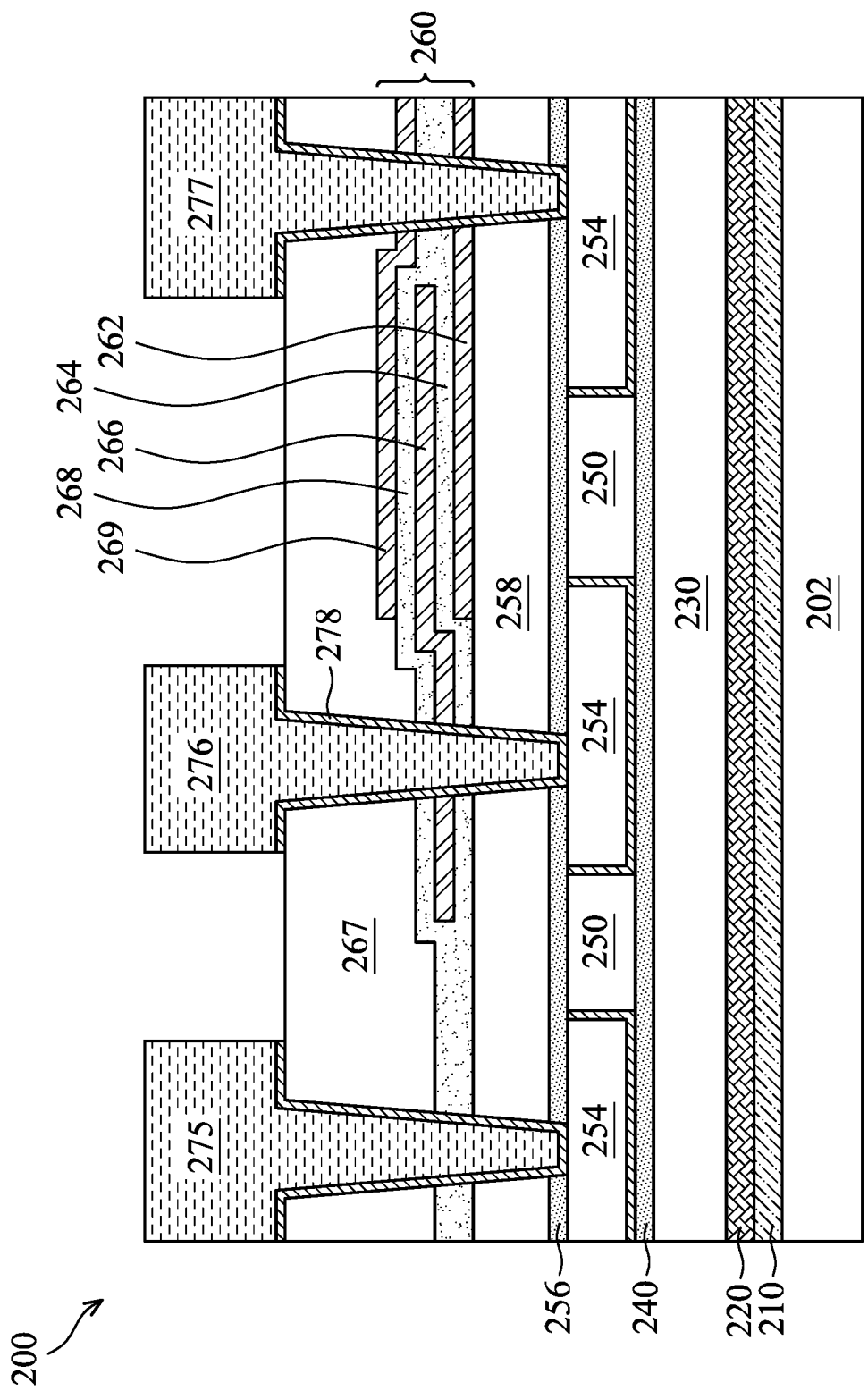

Referring to FIGS. 2 and 11, method 10 includes a block 22 where one or more upper contact features (or plugs) 275, 276, and 277 and a barrier layer 278 around the upper contact features are formed to penetrate through the fourth dielectric layer 267, the MIM structures 260, the third dielectric layer 258, and the second dielectric layer 256. The one or more upper contact features 275, 276, and 277 and the barrier layer 278 are formed to electrically contact the lower contact features 254. The upper contact features 275 are insulated from the MIM structures 260. Examples of the upper contact features 275 include the plugs 275a and 275b discussed with reference to FIGS. 1A-1C. The upper contact features 276 are insulated from the patterned top conductor plate layer 269 and the patterned bottom conductor plate layer 262 and is electrically coupled to the patterned middle conductor plate layer 266. Examples of the upper contact features 276 include the plugs 276a and 276b discussed with reference to FIGS. 1A-1C. The upper contact features 277 are electrically coupled to the patterned top conductor plate layer 269 and the patterned bottom conductor plate layer 262 and is insulated from the patterned middle conductor plate layer 266. Examples of the upper contact features 277 include the plugs 277a and 277b discussed with reference to FIGS. 1A-1C.

Forming the upper contact features 275, 276, and 277 involves multiple processes. For example, a dry etching process is performed to form openings that extend through the fourth dielectric layer 267, the MIM structures 260, the third dielectric layer 258, and the second dielectric layer 256. The openings expose top surfaces of the lower contact features 254. Further, the sidewalls of each opening may expose different conductor plate layers of the MIM structures 260. Then, a barrier layer 278 is first conformally deposited over the fourth dielectric layer 267 and into the openings using a suitable deposition technique, such as ALD, PVD, or CVD, and then a metal fill layer is deposited over the barrier layer 278 using a suitable deposition technique, such as ALD, PVD or CVD. The deposited barrier layer 278 and the metal fill layer are then patterned to form the upper contact features 275, 276 and 277 and the barrier layer 278, as illustrated in the example in FIG. 11. In some embodiments, the barrier layer 278 and the metal fill layer are patterned in a two-stage or multiple-stage etch process. In embodiments represented in FIG. 11, portions of the upper contact features 275, 276 and 277 above the fourth dielectric layer 267 have substantially straight sidewalls. In other embodiments not explicitly shown in FIG. 11, portions of the upper contact features 275, 276 and 277 above the fourth dielectric layer 267 have tapered sidewalls. In some embodiments, the upper contact features 275, 276 and 277 include a metal or a metal compound such as copper or aluminum copper, and the barrier layer 278 includes a metal or a metal nitride such as Ta, TaN, or TiN.

Referring to FIGS. 2 and 12, method 100 includes a block 24 where a passivation structure having a first passivation layer 280 and a second passivation layer 282 is formed over the upper contact features 275, 276, and 277 and over the fourth dielectric layer 267. As shown in FIG. 12, the first passivation layer 280 is formed over the upper contact features 275, 276, and 277 and the fourth dielectric layer 267. In some embodiments, the first passivation layer 280 may include one or more plasma-enhanced oxide layers, one or more undoped silica glass layers, or a combination thereof. The first passivation layer 280 may be formed using CVD, spin-on coating, or other suitable technique. In some implementations, the first passivation layer 280 may be formed to a thickness between about 1,000 nm and about 1,400 nm, including about 1,200 nm. The second passivation layer 282 is formed over the first passivation layer 280. In some embodiments, the second passivation layer 282 may include silicon nitride ($Si_3N_4$) and may be formed by CVD, PVD or a suitable method to a thickness between about 600 nm and about 800 nm, including about 700 nm.

Referring to FIGS. 2 and 12, method 10 includes a block 26 where further processes may be performed. Such further processes may include forming openings 284 through the first passivation layer 280 and the second passivation layer 282 to expose top surfaces of the upper contact features 275, 276, and 277; depositing one or more polymeric material layers, patterning the one or more polymeric material layers, depositing an under-bump-metallurgy (or under-bump-metallization, UBM) layer on the exposed surfaces of the upper contact features 275, 276, and 277, depositing a copper-containing bump layer, depositing a cap layer, depositing a solder layer, and reflowing of the solder layer. These further processes form contact structures for connecting the upper contact features 275, 276, and 277 to external circuitry.

Although not intended to be limiting, one or more embodiments of the present disclosure provide many benefits to a semiconductor device and a formation process thereof. For example, embodiments of the present disclosure provide MIM structures in a Tetris-like or puzzle-like arrangement where one MIM structure has a top-down plate enclosure and an adjacent MIM structure has a bottom-up plate enclosure. Using such arrangement, more capacitance is provided by the MIM structures of the present disclosure than using other approaches for the same footprint on the underlying wafer. In some instances, the capacitance is increased by about 30% using the present disclosure.

In one example aspect, the present disclosure is directed to a semiconductor device. The semiconductor device includes a first metal-insulator-metal structure and a second metal-insulator-metal structure. The first metal-insulator-metal structure includes a first bottom conductor plate, a first portion of a first dielectric layer over the first bottom conductor plate, a first middle conductor plate over the first portion of the first dielectric layer, a first portion of a second dielectric layer over the first middle conductor plate, and a first top conductor plate over the first portion of the second dielectric layer. The second metal-insulator-metal structure includes a second bottom conductor plate, a second portion of the first dielectric layer over the second bottom conductor plate, a second middle conductor plate over the second portion of the first dielectric layer, a second portion of the second dielectric layer over the second middle conductor plate, and a second top conductor plate over the second portion of the second dielectric layer. In a cross-sectional view, the first bottom conductor plate is wider than the first middle conductor plate that is wider than the first top conductor plate, and the second bottom conductor plate is narrower than the second middle conductor plate that is narrower than the first top conductor plate.

In an embodiment of the semiconductor device, in the cross-sectional view, a first sum of a width of the first bottom conductor plate and a width of the second bottom conductor plate is about equal to a second sum of a width of the first middle conductor plate and a width of the second middle conductor plate. In a further embodiment, the first sum is about equal to a third sum of a width of the first top conductor plate and a width of the second top conductor plate.

In an embodiment, the semiconductor device further includes first, second, and third plugs through the first bottom conductor plate, the first dielectric layer, the first middle conductor plate, the second dielectric layer, and the first top conductor plate. The first plug is insulated from the first bottom conductor plate, the first middle conductor plate, and the first top conductor plate. The second plug is insulated from the first bottom conductor plate and the first top conductor plate and is electrically connected to the first middle conductor plate. The third plug is electrically connected to the first bottom conductor plate and the first top conductor plate and is insulated from the first middle conductor plate.

In an embodiment of the semiconductor device, in the cross-sectional view, a first distance between the first and the second bottom conductor plates is about equal to a second distance between the first and the second middle conductor plates. In a further embodiment, the first distance is about equal to a third distance between the first and the second top conductor plates. In a further embodiment, each of the first, the second, and the third distances is about 0.2 μm to 10 μm.

In an embodiment of the semiconductor device, in the cross-sectional view, the first metal-insulator-metal structure is adjacent to the second metal-insulator-metal structure without any other metal-insulator-metal structure in between. In another embodiment, the first bottom conductor plate and the second top conductor plate have about same width in the cross-sectional view.

In an embodiment of the semiconductor device, each of the first and the second bottom conductor plates, the first and the second middle conductor plates, and the first and the second top conductor plates includes TiN, and each of the first and the second dielectric layers includes a triple layer stack having a layer of $ZrO_2$ over a layer of $Al_2O_3$ over another layer of $ZrO_2$.

In another example aspect, the present disclosure is directed to a semiconductor structure. The semiconductor structure includes a substrate; a first metal layer over the substrate; a first insulating layer over the first metal layer; a second metal layer over the first insulating layer; a second insulating layer over the second metal layer; and a third metal layer over the second insulating layer. A first metal-insulator-metal structure includes a first portion of the first metal layer, a first portion of the second metal layer, and a first portion of the third metal layer that are stacked vertically one over another. A second metal-insulator-metal structure includes a second portion of the first metal layer, a second portion of the second metal layer, and a second portion of the third metal layer that are stacked vertically one over another. The first and the second portions of the first metal layer are adjacent to each other and there is no other portion of the first metal layer in between. The first and the second portions of the second metal layer are adjacent to each other and there is no other portion of the second metal layer in between. The first and the second portions of the third metal layer are adjacent to each other and there is no other portion of the third metal layer in between. Along a first direction, the first portion of the first metal layer is wider than the second portion of the first metal layer, and the first portion of the third metal layer is narrower than the second portion of the third metal layer.

In an embodiment of the semiconductor structure, the first portion of the first metal layer is wider than the first portion of the second metal layer, and the second portion of the first metal layer is narrower than the second portion of the second metal layer. In a further embodiment, the first portion of the second metal layer is wider than the first portion of the third metal layer, and the second portion of the second metal layer is narrower than the second portion of the third metal layer.

In another embodiment of the semiconductor structure, a first distance between the first and the second portions of the first metal layer is about equal to a second distance between the first and the second portions of the second metal layer. In a further embodiment, the first distance is about equal to a third distance between the first and the second portions of the third metal layer. In a further embodiment, each of the first, the second, and third distances is in a range from 0.2 µm to 10 µm.

In yet another example aspect, the present disclosure is directed to a semiconductor structure. The semiconductor structure includes a substrate; a first metal layer over the substrate; a first insulating layer over the first metal layer; a second metal layer over the first insulating layer; a second insulating layer over the second metal layer; and a third metal layer over the second insulating layer. A first metal-insulator-metal structure includes a first portion of the first metal layer, a first portion of the second metal layer, and a first portion of the third metal layer that are stacked vertically one over another. A second metal-insulator-metal structure includes a second portion of the first metal layer, a second portion of the second metal layer, and a second portion of the third metal layer that are stacked vertically one over another. In a cross-sectional view, the first portion of the first metal layer is wider than the second portion of the first metal layer, the first portion of the third metal layer is narrower than the second portion of the third metal layer, the first portion of the first metal layer is wider than the first portion of the second metal layer, and the second portion of the first metal layer is narrower than the second portion of the second metal layer.

In an embodiment of the semiconductor structure, the first portion of the second metal layer is wider than the first portion of the third metal layer, and the second portion of the second metal layer is narrower than the second portion of the third metal layer.

In an embodiment, the semiconductor structure further includes first, second, and third plugs extending through the first, the second, and the third metal layers and the first and the second insulating layers. The first plug is insulated from the first, the second, and the third metal layers. The second plug is insulated from the first and the third metal layers and is electrically connected to the first portion of the second metal layer. The third plug is electrically connected to the first portion of the first metal layer and the first portion of the third metal layer and is insulated from the second metal layer. In a further embodiment, the semiconductor structure includes a third insulating layer between the first metal layer and the substrate and metal wires embedded in the third insulating layer, wherein the first, the second, and the third plugs are electrically connected to the metal wires.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first metal-insulator-metal structure comprising:
        a first bottom conductor plate,
        a first portion of a first dielectric layer over the first bottom conductor plate,
        a first middle conductor plate over the first portion of the first dielectric layer,
        a first portion of a second dielectric layer over the first middle conductor plate, and
        a first top conductor plate over the first portion of the second dielectric layer; and
    a second metal-insulator-metal structure comprising:
        a second bottom conductor plate,
        a second portion of the first dielectric layer over the second bottom conductor plate,
        a second middle conductor plate over the second portion of the first dielectric layer,
        a second portion of the second dielectric layer over the second middle conductor plate, and
        a second top conductor plate over the second portion of the second dielectric layer,
    wherein in a cross-sectional view, the first bottom conductor plate is wider than the first middle conductor plate that is wider than the first top conductor plate, and the second bottom conductor plate is narrower than the second middle conductor plate that is narrower than the second top conductor plate.

2. The semiconductor device of claim 1, wherein in the cross-sectional view, a first sum of a width of the first bottom conductor plate and a width of the second bottom conductor plate is about equal to a second sum of a width of the first middle conductor plate and a width of the second middle conductor plate.

3. The semiconductor device of claim 2, wherein the first sum is about equal to a third sum of a width of the first top conductor plate and a width of the second top conductor plate.

4. The semiconductor device of claim 1, further comprising:
first, second, and third plugs through the first bottom conductor plate, the first dielectric layer, the first middle conductor plate, the second dielectric layer, and the first top conductor plate, wherein the first plug is insulated from the first bottom conductor plate, the first middle conductor plate, and the first top conductor plate, wherein the second plug is insulated from the first bottom conductor plate and the first top conductor plate and is electrically connected to the first middle conductor plate, wherein the third plug is electrically connected to the first bottom conductor plate and the first top conductor plate and is insulated from the first middle conductor plate.

5. The semiconductor device of claim 1, wherein in the cross-sectional view, a first distance between the first and the second bottom conductor plates is about equal to a second distance between the first and the second middle conductor plates.

6. The semiconductor device of claim 5, wherein the first distance is about equal to a third distance between the first and the second top conductor plates.

7. The semiconductor device of claim 6, wherein each of the first, the second, and the third distances is about 0.2 μm to 10 μm.

8. The semiconductor device of claim 1, wherein in the cross-sectional view, the first metal-insulator-metal structure is adjacent to the second metal-insulator-metal structure without any other metal-insulator-metal structure in between.

9. The semiconductor device of claim 1,
wherein in the cross-sectional view, the first bottom conductor plate and the second top conductor plate have about same width,
wherein an edge of the first conductor plate and an edge of the second top conductor plate are vertically aligned.

10. The semiconductor device of claim 1, wherein each of the first and the second bottom conductor plates, the first and the second middle conductor plates, and the first and the second top conductor plates includes TiN, and each of the first and the second dielectric layers includes a triple layer stack having a layer of $ZrO_2$ over a layer of $Al_2O_3$ over another layer of $ZrO_2$.

11. A semiconductor structure, comprising:
a substrate;
a first metal layer over the substrate;
a first insulating layer over the first metal layer;
a second metal layer over the first insulating layer;
a second insulating layer over the second metal layer;
a third metal layer over the second insulating layer, and
first, second, and third plugs through the metal layer, the first insulating layer, the second metal layer, the second insulating layer, and the third metal layer,
wherein a first metal-insulator-metal structure includes a first portion of the first metal layer, a first portion of the second metal layer, and a first portion of the third metal layer that are stacked vertically one over another, wherein a second metal-insulator-metal structure includes a second portion of the first metal layer, a second portion of the second metal layer, and a second portion of the third metal layer that are stacked vertically one over another,
wherein the first plug is insulated from the first portion of the first metal layer, the first portion of the second metal layer, and the first portion of the third metal layer,
wherein the second plug is insulated from the first portion of the first metal layer and the first portion of the third metal layer and is electrically connected to the first portion of the second metal layer, wherein the third plug is electrically connected to the first portion of the first metal layer and the first portion of the third metal layer and is insulated from the first portion of the second metal layer,
wherein the first and the second portions of the first metal layer are adjacent to each other and there is no other portion of the first metal layer in between,
wherein the first and the second portions of the second metal layer are adjacent to each other and there is no other portion of the second metal layer in between,
wherein the first and the second portions of the third metal layer are adjacent to each other and there is no other portion of the third metal layer in between,
wherein along a first direction, the first portion of the first metal layer is wider than the second portion of the first metal layer, and the first portion of the third metal layer is narrower than the second portion of the third metal layer.

12. The semiconductor structure of claim 11, wherein the first portion of the first metal layer is wider than the first portion of the second metal layer, and wherein the second portion of the first metal layer is narrower than the second portion of the second metal layer.

13. The semiconductor structure of claim 12, wherein the first portion of the second metal layer is wider than the first portion of the third metal layer, and wherein the second portion of the second metal layer is narrower than the second portion of the third metal layer.

14. The semiconductor structure of claim 11, wherein a first distance between the first and the second portions of the first metal layer is about equal to a second distance between the first and the second portions of the second metal layer.

15. The semiconductor structure of claim 14, wherein the first distance is about equal to a third distance between the first and the second portions of the third metal layer.

16. The semiconductor structure of claim 15, wherein each of the first, the second, and third distances is in a range from 0.2 μm to 10 μm.

17. A semiconductor structure, comprising:
a substrate;
a first metal layer over the substrate;
a first insulating layer over the first metal layer;
a second metal layer over the first insulating layer;
a second insulating layer over the second metal layer; and
a third metal layer over the second insulating layer,
wherein a first metal-insulator-metal structure includes a first portion of the first metal layer, a first portion of the second metal layer, and a first portion of the third metal layer that are stacked vertically one over another, wherein a second metal-insulator-metal structure includes a second portion of the first metal layer, a second portion of the second metal layer, and a second portion of the third metal layer that are stacked vertically one over another, wherein in a cross-sectional view, the first portion of the first metal layer is wider than the second portion of the first metal layer, the first portion of the third metal layer is narrower than the second portion of the third metal layer, the first portion of the first metal layer is wider than the first portion of the second metal layer, and the second portion of the first metal layer is narrower than the second portion of the second metal layer.

18. The semiconductor structure of claim 17,
wherein the first portion of the second metal layer is wider than the first portion of the third metal layer, and the second portion of the second metal layer is narrower than the second portion of the third metal layer,
wherein an edge of the first portion of the first metal layer is vertically aligned with an edge of the second portion of the third metal layer.

19. The semiconductor structure of claim 17, further comprising:
first, second, and third plugs extending through the first, the second, and the third metal layers and the first and the second insulating layers, wherein the first plug is insulated from the first, the second, and the third metal layers, wherein the second plug is insulated from the first and the third metal layers and is electrically connected to the first portion of the second metal layer, wherein the third plug is electrically connected to the first portion of the first metal layer and the first portion of the third metal layer and is insulated from the second metal layer.

20. The semiconductor structure of claim 19, further comprising:
a third insulating layer between the first metal layer and the substrate; and
metal wires embedded in the third insulating layer, wherein the first, the second, and the third plugs are electrically connected to the metal wires.

* * * * *